US012748961B2

(12) United States Patent
Lee et al.

(10) Patent No.: US 12,748,961 B2
(45) Date of Patent: Sep. 29, 2026

(54) NEUROMORPHIC COMPUTING DEVICE WITH THREE-DIMENSIONAL MEMORY

(71) Applicant: Taiwan Semiconductor Manufacturing Company, Ltd., Hsinchu (TW)

(72) Inventors: Chieh Lee, Hsinchu (TW); Chia-En Huang, Xinfeng Township (TW); Yi-Chang Liu, Hsinchu City (TW); Wen-Chang Cheng, Richmond, TX (US); Yih Wang, Hsinchu City (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 1163 days.

(21) Appl. No.: 17/824,306

(22) Filed: May 25, 2022

(65) Prior Publication Data

US 2023/0385625 A1 Nov. 30, 2023

(51) Int. Cl.

| | |
|---|---|
| ***G06N 3/065*** | (2023.01) |
| ***G06F 7/544*** | (2006.01) |
| ***H03M 1/12*** | (2006.01) |

(52) U.S. Cl.

CPC .......... *G06N 3/065* (2023.01); *G06F 7/5443* (2013.01); *H03M 1/12* (2013.01)

(58) Field of Classification Search

CPC ......... G06N 3/065; G06F 7/5443; H03M 1/12

See application file for complete search history.

(56) References Cited

U.S. PATENT DOCUMENTS

2018/0253643 A1* 9/2018 Buchanan ............. G06F 7/5443
2020/0035305 A1* 1/2020 Choi .................. G11C 13/0028

* cited by examiner

*Primary Examiner* — David Yi
*Assistant Examiner* — Paul Coleman
(74) *Attorney, Agent, or Firm* — Foley & Lardner LLP

(57) ABSTRACT

Disclosed herein are related to a device for performing neuromorphic computing. In one aspect, a device includes a back end of line layer including a three-dimensional memory array. The three-dimensional memory array may include a plurality of memory cells to store a plurality sets of weight values of a neural network model. In one aspect, the device includes a front end of line layer including a controller. The controller may apply one or more input voltages corresponding to an input to the neural network model to the three-dimensional memory array, and receive one or more output voltages from the three-dimensional memory array to perform computations of the neural network model.

20 Claims, 7 Drawing Sheets

300

NEUROMORPHIC COMPUTING DEVICE WITH THREE-DIMENSIONAL MEMORY

BACKGROUND

A neuromorphic computing device implements a neural network model to perform a complex analysis such as an image processing, object recognition, feature extraction, speech recognition, etc. In one implementation, a neural network model includes a network of nodes. Each node may represent a value to perform one or more multiply-accumulation operations to achieve another value or a subsequent node. Through the computations of a large network of nodes, a complex analysis such as an image processing, object recognition, feature extraction, or speech recognition can be automatically performed. However, performing a large number of multiply-accumulation operations can be computationally exhaustive, and may consume a large amount of hardware resources.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
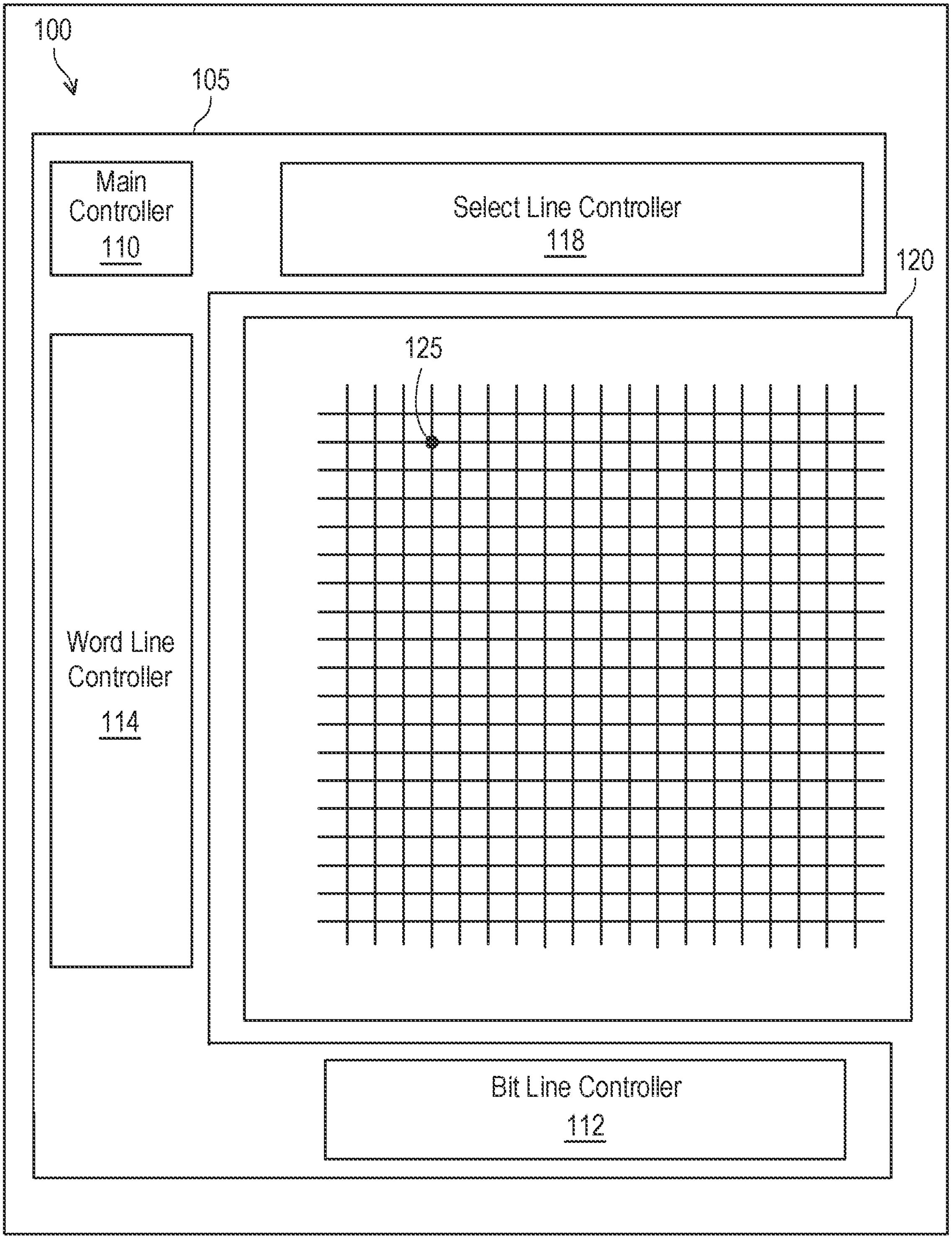
FIG. 1 illustrates a schematic block diagram of an example device to perform neuromorphic computations, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Disclosed herein are related to a device for performing neuromorphic computing. In one aspect, the device includes a back end of line layer including a three-dimensional memory array. The three-dimensional memory array may include a plurality of memory cells to store a plurality sets of weight values of a neural network model. In one aspect, the device includes a front end of line layer including a controller. The controller may apply, to the three-dimensional memory array, one or more input voltages corresponding to an input to the neural network model, and receive, from the three-dimensional memory array, one or more output voltages corresponding to computations of the neural network model, in response to the one or more input voltages applied.

Beneficially, the disclosed device can achieve several advantages. In one implementation, a neuromorphic computation involves storing a large number (e.g., more than billions) of weight values of a neural network model in a memory array, applying input voltages corresponding to input values of nodes of the neural network model to the memory array, and receiving output voltages corresponding to multiply-accumulation results from the memory array. Performing a large number of multiply-accumulation operations with a large number of logic circuits (e.g., adders, multipliers) can consume a large amount of power and reduce the speed of performing neuromorphic computations. In one aspect, a three-dimensional memory array may be configured or arranged to perform a set of multiply-accumulation operations without implementing complex logic circuits, such that the disclosed device can perform neuromorphic computations in a power efficient manner with an improved operating speed. Moreover, the three-dimensional memory array can store a large number of weight values (e.g., more than billions) in a small area, such that the disclosed device can be implemented in an area efficient manner.

Furthermore, the disclosed device can achieve power savings with an improved operating speed by reducing lengths of routing metal rails. In one implementation, lengths of routing metals for applying the input voltages to a two-dimensional memory array or receiving the output voltages from the two-dimensional memory array may increase, according to the number of nodes in the neural network model. Parasitic components such as parasitic capacitance and parasitic resistance of long routing metal rails may increase the power consumption or reduce the speed of the neuromorphic computations. By disposing or stacking the three-dimensional memory array above a controller for controlling operations of the three-dimensional memory array, lengths of routing metal rails between the three-dimensional memory array and the controller can be reduced. By reducing the lengths of routing metal rails between the three-dimensional memory array and the controller, the disclosed device can achieve power savings and an improved operating speed.

In some embodiments, one or more components can be embodied as one or more transistors. The transistors in this disclosure are shown to have a certain type (N-type or P-type), but embodiments are not limited thereto. The transistors can be any suitable type of transistor including, but not limited to, metal oxide semiconductor field effect transistors (MOSFETs), bipolar junction transistors (BJTs), high voltage transistors, high frequency transistors, FinFETs, planar MOS transistors with raised source/drains, nanosheet FETs, nanowire FETs, or the like. Furthermore, one or more transistors shown or described herein can be embodied as two or more transistors connected in parallel.

FIG. 1 is a diagram of a device 100 for performing a neuromorphic computation, in accordance with one embodiment. In some embodiments, the device 100 includes a controller 105 (also referred to as "a control circuit 105") and a memory array 120. The memory array 120 may include a plurality of storage circuits or memory cells 125 arranged in a three-dimensional array. Each memory cell 125 may be coupled to a corresponding word line WL, a corresponding bit line BL, and a corresponding select line SL. The controller 105 may be disposed in a front end of line layer, and the memory array 120 may be disposed in a back end of line layer above the front end of layer. The controller 105 may apply or receive electrical signals for performing neuromorphic computations through word lines WL, bit lines BL, and select lines SL. In other embodiments, the device 100 includes more, fewer, or different components than shown in FIG. 1.

The memory array 120 is a hardware component that stores data. The memory array 120 may be embodied as a semiconductor memory device. The memory array 120 includes three-dimensionally stacked storage circuits or memory cells 125. The memory array 120 includes word lines WL, each extending in a first direction (e.g., X-direction), select lines SL, each extending in a second direction (e.g., Z-direction), and bit lines BL, each extending in the second direction. The select lines SL, the word lines WL and the bit lines BL may be conductive metals or conductive rails. In one aspect, each memory cell 125 is coupled to a corresponding word line WL, a corresponding bit line BL, and a corresponding select line SL, and can be operated according to voltages or currents through the corresponding word line WL, the corresponding bit line BL, and the corresponding select line SL. Each memory cell 125 may include a volatile memory, a non-volatile memory, or a combination of them. Each memory cell 125 may store a weight value of a neural network model. By storing weight values with the three-dimensional memory array 120, the device 100 can be implemented in an area efficient manner. In some embodiments, the memory array 120 includes additional lines (e.g., reference lines, reference control lines, power rails, etc.). In one aspect, the memory array 120 is arranged to perform multiply-accumulation operations in an efficient manner as described with respect to FIG. 4.

The controller 105 is a hardware component that controls operations of the memory array 120. In some embodiments, the controller 105 includes a bit line controller 112, a word line controller 114, a select line controller 118, and a main controller 110. The bit line controller 112, the word line controller 114, the select line controller 118, and the main controller 110 may be embodied as logic circuits, analog circuits, or a combination of them. In one configuration, the word line controller 114 is a circuit that provides a voltage or current through one or more word lines WL of the memory array 120. The bit line controller 112 is a circuit that provides or senses a voltage or current through one or more bit lines BL of the memory array 120, and the select line controller 118 is a circuit that provides a voltage or current through one or more select lines SL of the memory array 120. In one configuration, the main controller 110 is a circuit that provides control signals or clock signals to synchronize operations of the bit line controller 112, the word line controller 114, and the select line controller 118. The bit line controller 112 may be coupled to bit lines BL of the memory array 120, the word line controller 114 may be coupled to word lines WL of the memory array 120, and the select line controller 118 may be coupled to select lines SL of the memory array 120. In some embodiments, the controller 105 includes more, fewer, or different components than shown in FIG. 1.

In one aspect, the main controller 110 configures the bit line controller 112, the word line controller 114, and the select line controller 118 to perform neuromorphic computations. In some embodiments, the main controller 110 is embodied as a processor and a non-transitory computer readable medium storing instructions when executed by the processor cause the processor to perform or execute various functions of the main controller 110 or the controller 105 described herein. In one approach, the main controller 110 causes or configures the select line controller 118 to select memory cells storing weight values of nodes in one or more weight layers of a neural network model through select lines SL. The main controller 110 may cause or configure the word line controller 114 to apply input voltages corresponding to input data of nodes of the neural network model through word lines WL. The main controller 110 may cause or configure the bit line controller 112 to receive output voltages corresponding to computation results (e.g., multiply-accumulation computation results) of the nodes through bit lines BL. The main controller 110 may also cause or configure the bit line controller 112 to apply voltages or currents corresponding to the computation results to bit lines BL to obtain computation results of nodes in a subsequent layer of the neural network model.

Figure 2A:
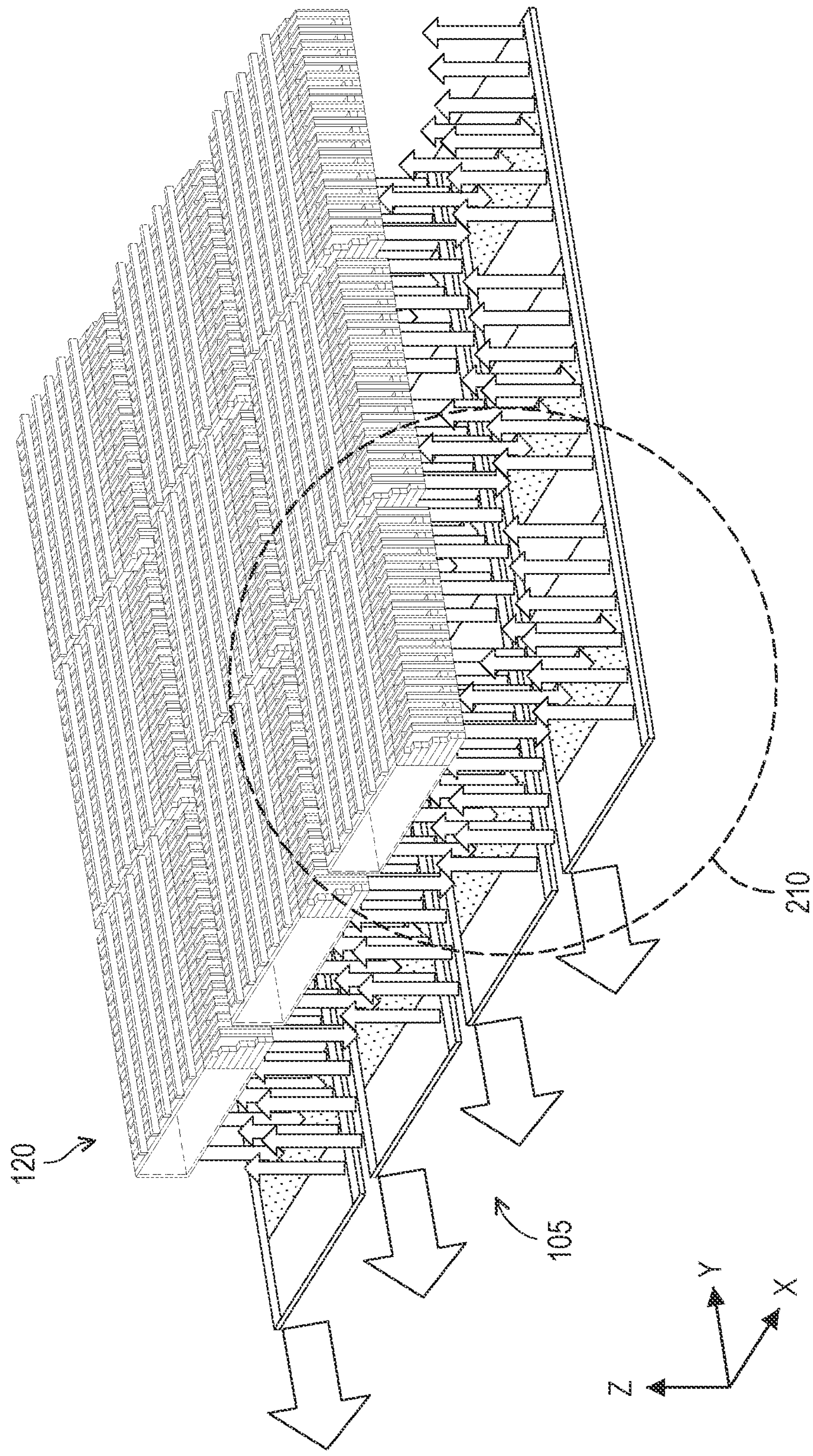
FIG. 2A illustrates a plan view of an example device including a memory array for storing weight values of a neural network model and a controller for controlling operations of the memory array for performing neuromorphic computations, in accordance with some embodiments.
Figure 2B:
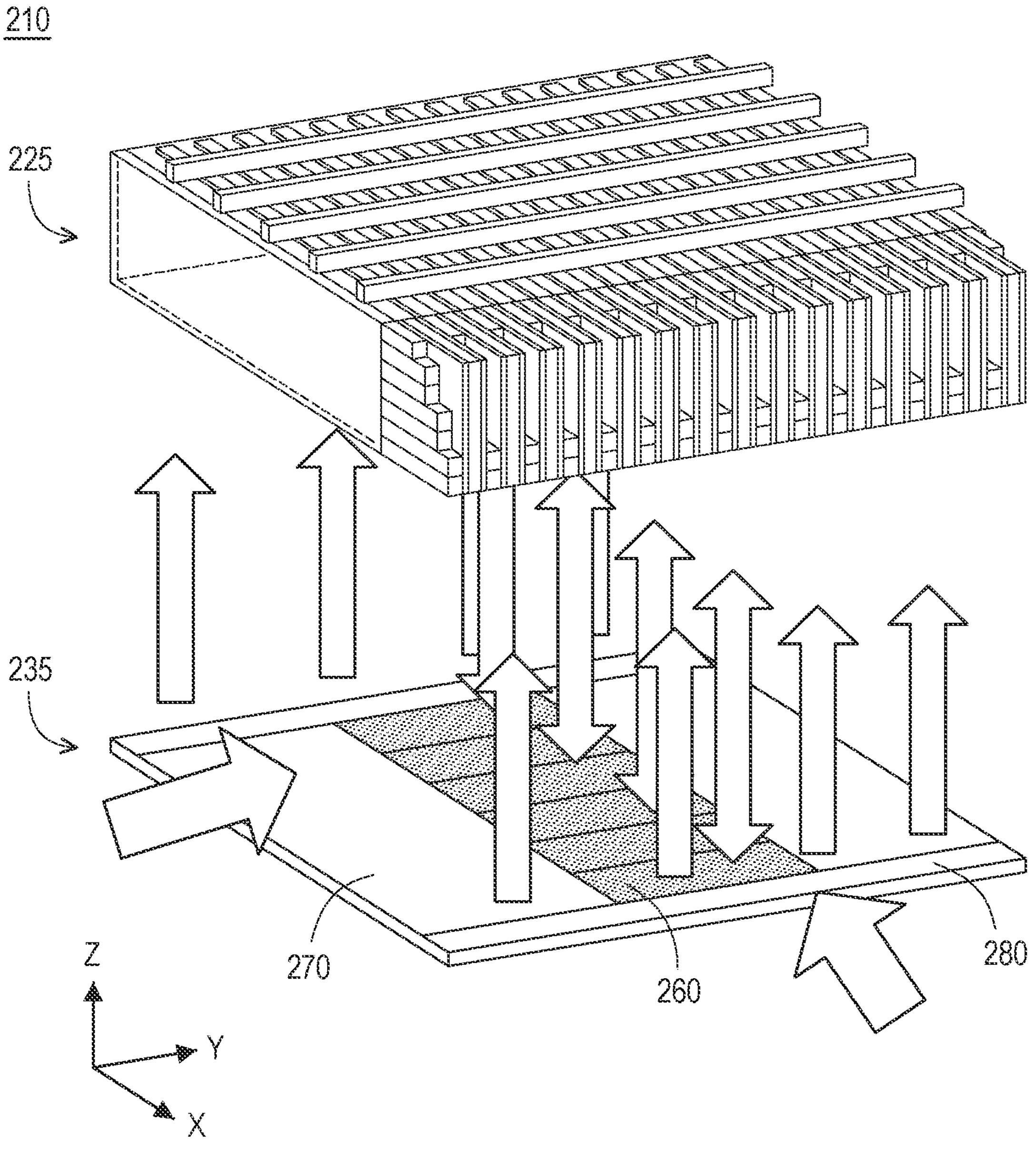
FIG. 2B illustrates a plan view of a portion of the example device in FIG. 2A, in accordance with some embodiments.

FIG. 2A illustrates a plan view of an example device 100 including the memory array 120 for storing weight values of a neural network model and the controller 105 for controlling operations of the memory array 120 for performing neuromorphic computations, in accordance with some embodiments. FIG. 2B illustrates a plan view of a portion 210 of the device 100 in FIG. 2A, in accordance with some embodiments. In one aspect, the three-dimensional memory array 120 is formed or disposed in a back end of line layer, and the controller 105 is formed or disposed in a front end of line layer. The three-dimensional memory array 120 may be disposed above the controller 105 along the Z-direction to achieve area efficiency.

In some embodiments, the memory array 120 includes a plurality of memory arrays 225, and the controller 105 includes a plurality of control circuits 235. Each memory array 225 may be disposed over a corresponding control circuit 235 along a Z-direction as shown in FIG. 2B. A memory array 225 may be connected to a corresponding control circuit 235 through interconnect metal rails extending along the Z-direction. In some embodiments, each control circuit 235 includes sense amplifiers 260 (also referred to as "sensing circuits 260"), sense amplifier controller 270, and word line controllers 280 (also referred to as "word line control circuits 280"). These components may operate together to apply signals (e.g., voltage or current) corresponding to input values of nodes of a neural network model to the memory array 225, and receive signals corresponding to multiply-accumulation results of the neural network model from the memory array 225 for performing neuromorphic computations. In some embodiments, the control circuit 235 includes more, fewer, or different components than shown in FIGS. 2A and 2B.

In some embodiments, the sense amplifiers 260 are circuits or components for receiving voltages or currents from the memory array 225, and determining values corresponding to the received voltages or currents. In one aspect, a voltage or current received from the memory array 225 may correspond to a multiply-accumulation result of a node of a neural network model. Each sense amplifier 260 may be embodied as or may be part of an analog to digital converter. The sense amplifiers 260 may be part of the bit line controller 112. In one configuration, the sense amplifiers 260 may be disposed along the X-direction, such that each sense amplifier 260 may be disposed below a corresponding column of memory cells 125. In some embodiments, the sense amplifiers 260 can be replaced by different components that can perform the functionalities of the sense amplifiers 260 described herein.

In one configuration, the sense amplifier controllers 270 are circuits or components for controlling the sense amplifiers 260. Each sense amplifier controller 270 may receive a control signal from the main controller 110, and enable or disable one or more sense amplifiers 260 according to the control signal. Each sense amplifier controller 270 may receive signals corresponding to values of multiply-accumulation results from the sense amplifiers 260, and provide the received signals to the main controller 110. Each sense amplifier controller 270 may include or may be embodied as a logic circuit. The sense amplifier controllers 270 may be part of the bit line controller 112. In one configuration, the sense amplifier controller 270 may extend along the X-direction, where the sense amplifiers 260 may be disposed between the sense amplifier controllers 270. In this configuration, each sense amplifier 260 may be disposed below a corresponding column of memory cells 125, and the sense amplifier controller 270 can be placed close to the sense amplifiers 260 to configure or control operations of the sense amplifier 260. In some embodiments, the sense amplifier controllers 270 can be replaced by different components that can perform the functionalities of the sense amplifier controllers 270 described herein.

In one configuration, the word line controllers 280 are circuits or components for applying voltages or currents to one or more word lines of the memory array 225. The word line controller 280 may be part of the word line controller 114. Each word line controller 280 may receive a control signal from the main controller 110, and generate voltages or currents to apply to one or more word lines, according to the control signal. In one aspect, voltages or currents applied to the word lines of the memory array 225 may correspond to input values to nodes of a neural network model. Each word line controller 280 may include or may be embodied as an amplifier circuit. In one configuration, the word line controllers 280 extend along the Y-direction. In one configuration, the word line controllers 280 are disposed on edges of the control circuit 235. The sense amplifiers 260 may be disposed between two word line controllers 280. In this configuration, the word line controllers 280 can be connected to word lines on edges of the memory array 225, and apply signals (e.g., voltages or currents) to memory cells through the word lines. In some embodiments, the word line controllers 280 can be replaced by different components that can perform the functionalities of the word line controllers 280 described herein.

Beneficially, the device 100 arranged as shown in FIGS. 2A and 2B can achieve several advantages. In one implementation, a neuromorphic computation involves storing a large number (e.g., more than billions) of weight values of a neural network model in a memory array, applying input voltages corresponding to input values of nodes of the neural network model to the memory array, and receiving output voltages corresponding to multiply-accumulation results from the memory array. Performing a large number of multiply-accumulation operations with a large number of logic circuits (e.g., adders, multipliers) can consume a large amount of power and reduce the speed of performing neuromorphic computations. In one aspect, a three-dimensional memory array 120 may be configured or arranged to perform a set of multiply-accumulation operations without implementing complex logic circuits (e.g., multipliers or adders), such that the device 100 can perform neuromorphic computations in a power efficient manner with an improved operating speed. Moreover, the three-dimensional memory array 120 can store a large number of weight values (e.g., more than billions) in a small area, such that the device 100 can be implemented in an area efficient manner.

Furthermore, the device 100 can achieve power savings with an improved operating speed by reducing lengths of routing metal rails. In one implementation, lengths of routing metals, for example extending along the X-direction or Y-direction, for applying the input voltages to a two-dimensional memory array or receiving the output voltages from the two-dimensional memory array may increase, according to the number of nodes in the neural network model. Parasitic components such as parasitic capacitance and parasitic resistance of long routing metal rails may increase the power consumption or reduce the speed of the neuromorphic computations. By disposing or stacking the three-dimensional memory array 120 above the controller 105, lengths of routing metal rails extending along the Z-direction between the three-dimensional memory array 120 and the controller 105 can be reduced. By reducing the lengths of routing metal rails between the three-dimensional memory array 120 and the controller 105, the device 100 can perform neuromorphic computations in a power efficient manner with an improved speed.

Figure 3:
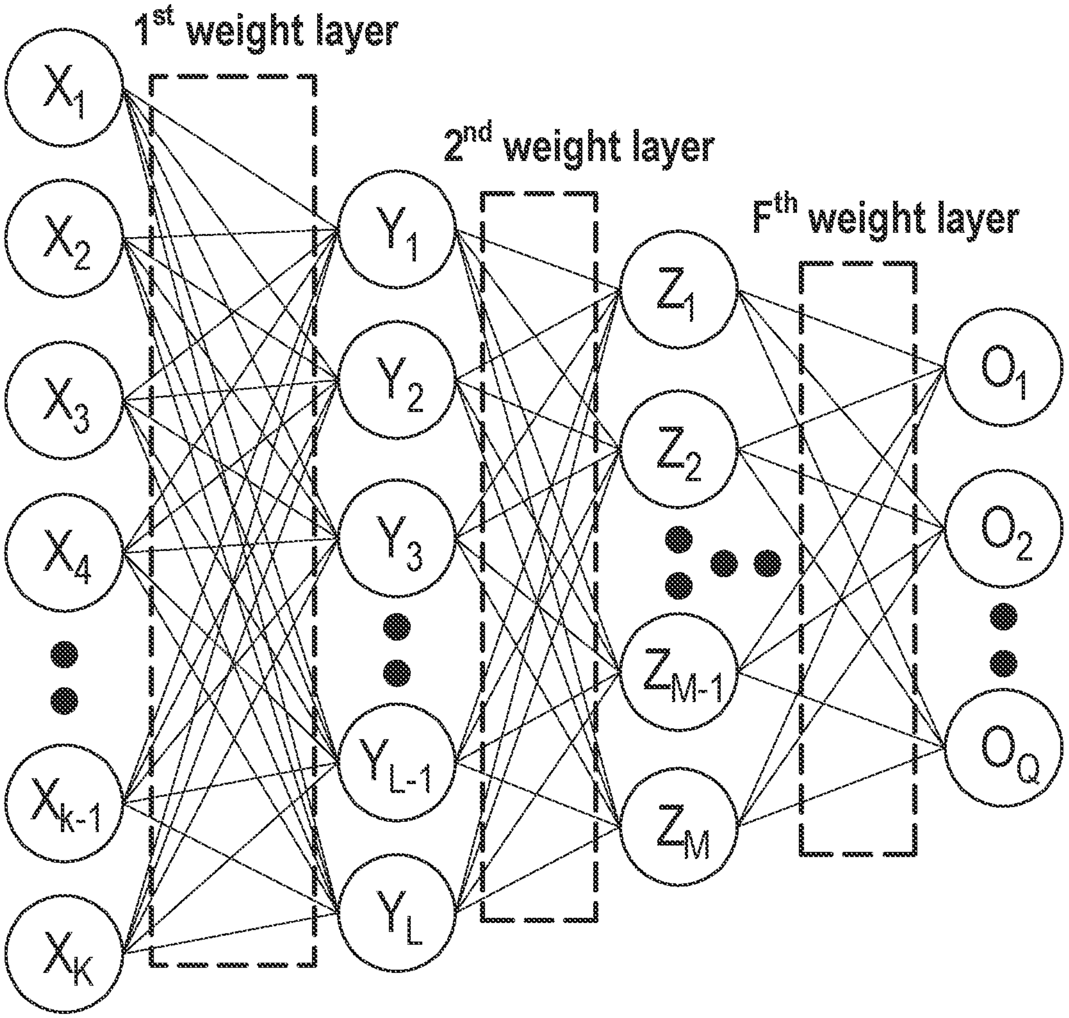
FIG. 3 illustrates an example neural network model, in accordance with some embodiments.

FIG. 3 illustrates an example neural network model 300, in accordance with some embodiments. In some embodiments, the neural network model 300 can be implemented by the device 100. The device 100 can implement the neural network model 300 to perform a complex analysis such as an image processing, object recognition, feature extraction, speech recognition, etc. In one configuration, the neural network model 300 includes a network of nodes $X_1 \ldots X_k$, $Y_1 \ldots Y_L$, $Z_1 \ldots Z_m$, $O_1 \ldots O_Q$. Each node may correspond to a value for performing multiply-accumulation operations. For example, a value of $X_1$ can be multiplied by a weight represented by a connection between $X_1$ and $Y_1$. In one aspect, $Y_j$ can be obtained by $$\sum_{i=1}^{i=k} X_i W_{ij},$$

where $W_{ij}$ is a weight value represented by a connection between $X_1$ and $Y_j$. Through the computations of a large network of nodes, a complex analysis such as an image processing, object recognition, feature extraction, or speech recognition can be automatically performed. The neural network model 300 is provided an example, and other neural network model having different configurations can be implemented.

Figure 4:
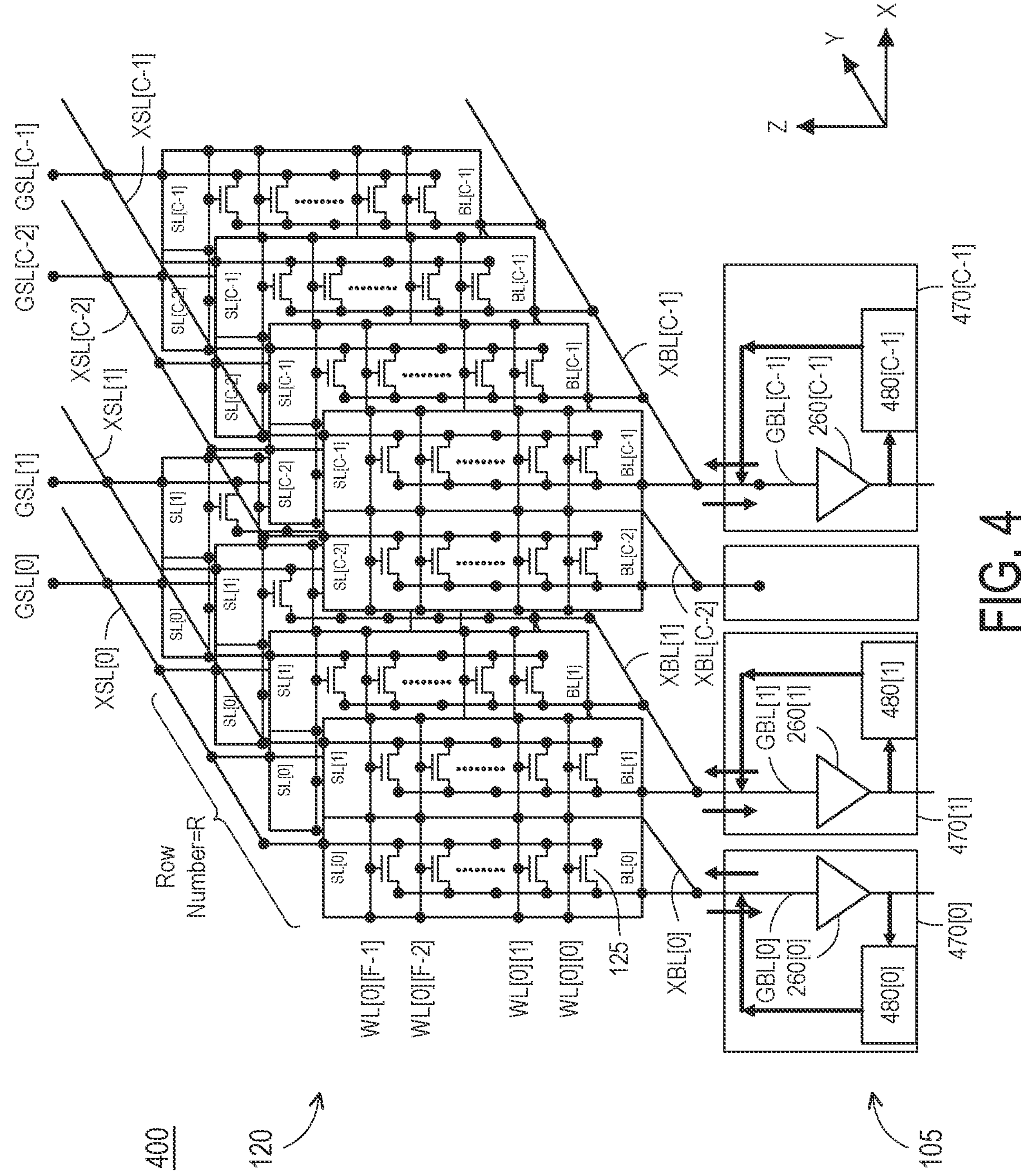
FIG. 4 illustrates a schematic diagram of a portion of a three-dimensional memory array and a portion of a controller to perform neuromorphic computations, in accordance with some embodiments.

FIG. 4 illustrates a schematic diagram 400 of a portion of a three-dimensional memory array 120 and a portion of the controller 105 to perform neuromorphic computations, in accordance with some embodiments. The memory array 120 may be formed in a back end of line layer, and the controller 105 may be formed in a front end of line layer. In some embodiments, the memory array 120 includes a set of three-dimensionally stacked memory cells 125 with R number of rows along the Y-direction, C number of columns along the X-direction, and F number of layers along the Z-direction. By arranging memory cells 125 as shown in FIG. 4, a storage density of the memory array 120 can be increased. Each memory cell 125 may be a volatile memory cell, a non-volatile memory cell, or any memory cell that can store data. Each memory cell 125 may be embodied as a transistor (e.g., MOSFET, GAAFET, FinFET). Each memory cell 125 may be configured according to programmed data. For example, a memory cell 125 storing a bit "1" may have a lower threshold voltage than a memory cell 125 storing a bit "0". Hence, according to a programmed bit or data, a memory cell 125 may conduct current or not conduct current.

In one configuration, a subset of memory cells 125 disposed along the Z-direction is connected in parallel between a local select line SL and a local bit line BL. A local select line SL may be a metal rail, at which first electrodes (e.g., drain electrodes) of memory cells 125 are connected. A local bit BL line may be a metal rail, at which second electrodes (e.g., source electrodes) of memory cells 125 are connected. The local select line SL may be connected to a corresponding interconnect select line XSL extending along the Y-direction. An interconnect select line XSL may be a metal rail to couple corresponding local select lines SL in a column. The local bit line BL may be connected to a corresponding interconnect bit line XBL extending along the Y-direction. An interconnect bit line XBL may be a metal rail to couple corresponding local bit lines BL in a column.

In one configuration, the memory array 120 includes global select lines GSL extending along the Z-direction. A global select line GSL may be a metal rail to couple interconnect select lines XSL to the select line controller 118. In one example, local select lines SL[X] in a same column are coupled to an interconnect select line XSL[X] associated with the column, which is coupled to a global select line GSL[X] associated with the column. In this configuration, the select line controller 118 can provide a supply voltage to memory cells 125 in a selected column through the global select line GSL, interconnect select line XSL, and local select lines SL in that column.

In one configuration, the memory array 120 includes global bit lines GBL extending along the Z-direction. A global bit line GBL may be a metal rail to couple interconnect bit lines XBL to the bit line controller 112. In one example, local bit lines BL[X] in a same column are coupled to an interconnect bit line XBL[X] associated with the column, which is coupled to a global bit line GBL[X] associated with the column. In this configuration, current through memory cells 125 in a selected column can flow and can be provided to the bit line controller 112 through the local bit lines BL, interconnect bit line XBL, and global bit line GBL in that column.

In one configuration, the memory array 120 includes word lines WL extending along the X-direction. A word line WL may be a metal rail coupled to gate electrodes of corresponding memory cells 125 disposed along the X-direction. The word line WL may be also coupled to the word line controller 114 (e.g., word line control circuits 280). Through a word line WL, the word line controller 114 may apply a voltage to enable or disable one or more memory cells 125 coupled to the word line WL. In one aspect, each memory cell may conduct current to perform a multiplication function, according to a programmed bit and a voltage applied through a word line WL. For example, if a first voltage (e.g., 1V) is applied to a word line WL, one or more memory cells 125 storing a bit "1" and connected to the word line WL may conduct current. However, one or more memory cells 125 storing a bit "0" and connected to the word line WL may not conduct current, despite the first voltage (e.g., 1V) applied to a word line WL. If a second voltage (e.g., 0V) is applied to a word line WL, then memory cells 125 coupled to the word line WL may not conduct current regardless of the programmed states.

In one aspect, the memory array 120 can perform multiply-accumulation operations in an efficient manner. In one aspect, memory cells 125 in each layer can store weight values of a corresponding weight layer of a neural network model. For example, memory cells 125 in a first layer may store weight values of a first layer of a neural network model, and memory cells 125 in a second layer may store weight values of a second layer of the neural network model. Moreover, in one aspect, memory cells 125 in a column in the same layer may store weight values associated with a node. For example, memory cells 125 in a first column of a first layer may store weight values in a first weight layer as represented by input connections to the node $Y_1$ in FIG. 3 and memory cells 125 in a second column of the first layer may store weight values in the first weight layer as represented by input connections to the node $Y_2$ in FIG. 3. Because each memory cell 125 may perform a multiplication function according to a voltage applied through a word line WL and a bit stored by the memory cell 125, the memory cells 125 in a column in a layer may perform multiplications to obtain a value corresponding to a node. In one aspect, current through local bit lines BL of a column can be combined through interconnect bit line XBL of the column and flow through the global bit line GBL of the column. Accordingly, accumulation or summation of multiplication results for a node can be performed in an efficient manner by combining current through local bit lines BL of a column. Because the three-dimensional memory array 120 can be configured or arranged to perform a set of multiply-accumulation operations without implementing logic circuits such as multipliers and adders, complex neuromorphic computations can be performed in a power efficient manner with an improved operating speed.

In one aspect, the memory array 120 as shown in FIG. 4 allows multiply-accumulation operations to be performed simultaneously. For example, multiply-accumulation operations can be performed per layer (or per multiple layers). In one approach, in response to signals applied through word lines in a layer, current can flow through global bit lines GBL, where current through each global bit line GBL may correspond to a multiply-accumulation result of a corresponding node for a weight layer of a neural network model. Hence, multiply-accumulation operations for different nodes in a layer (or multiple layers) can be performed simultaneously to improve operating speed.

In some embodiments, the controller 105 includes data processing circuits 470[0] . . . 470[C−1]. In one aspect, each data processing circuit 470 is associated with a corresponding column of the memory array 120. In one configuration, each data processing circuit 470 is coupled to a corresponding global bit line GBL. In some embodiments, each data processing circuit 470[X] includes a sense amplifier 260[X] and a buffer circuit 480[X]. The sense amplifier 260 can be embodied as or part of an analog to digital converter, and the buffer circuit 480 can be embodied as or part of a digital to analog converter. In some embodiments, the sense amplifier 260 can be replaced by other components that can perform the functionalities of the sense amplifier 260 described herein. In some embodiments, the buffer circuit 480 can be replaced by other components that can perform the functionalities of the buffer circuit 480 described herein. In some embodiments, each data processing circuit 470 includes more or fewer components than shown in FIG. 4.

In one configuration, the sense amplifier 260[X] includes an input port coupled to a global bit line GBL[X] and an output port coupled to an input port of a buffer circuit 480[X]. In one configuration, the buffer circuit 480[X] includes an output port coupled to the global bit line GBL[X] and the input port of the sense amplifier 260[X]. In this configuration, the sense amplifier 260[X] or analog to digital converter can receive a signal or current corresponding to multiply-accumulation results of one or more layers, and determine a digital representation of a value of a node corresponding to multiply-accumulation results as indicated by an amplitude of the signal or current. The buffer circuit 480[X] may receive the determined value or multiply-accumulation results of a node, and store the received value. In one aspect, the buffer circuit 480[X] may generate a voltage or current corresponding to the stored value, and apply the voltage or current to the global bit line GBL[X] to perform write back. By applying the voltage or current to the global bit line GBL[X], the memory array 120 can perform computations for multiple layers. For example, the buffer circuit 480[X] may apply or write back a voltage or current corresponding to the stored computations results of a first layer to a global bit line GBL[X], while the memory array 120 is configured to perform multiply-accumulation operations for a second layer.

Figure 5:
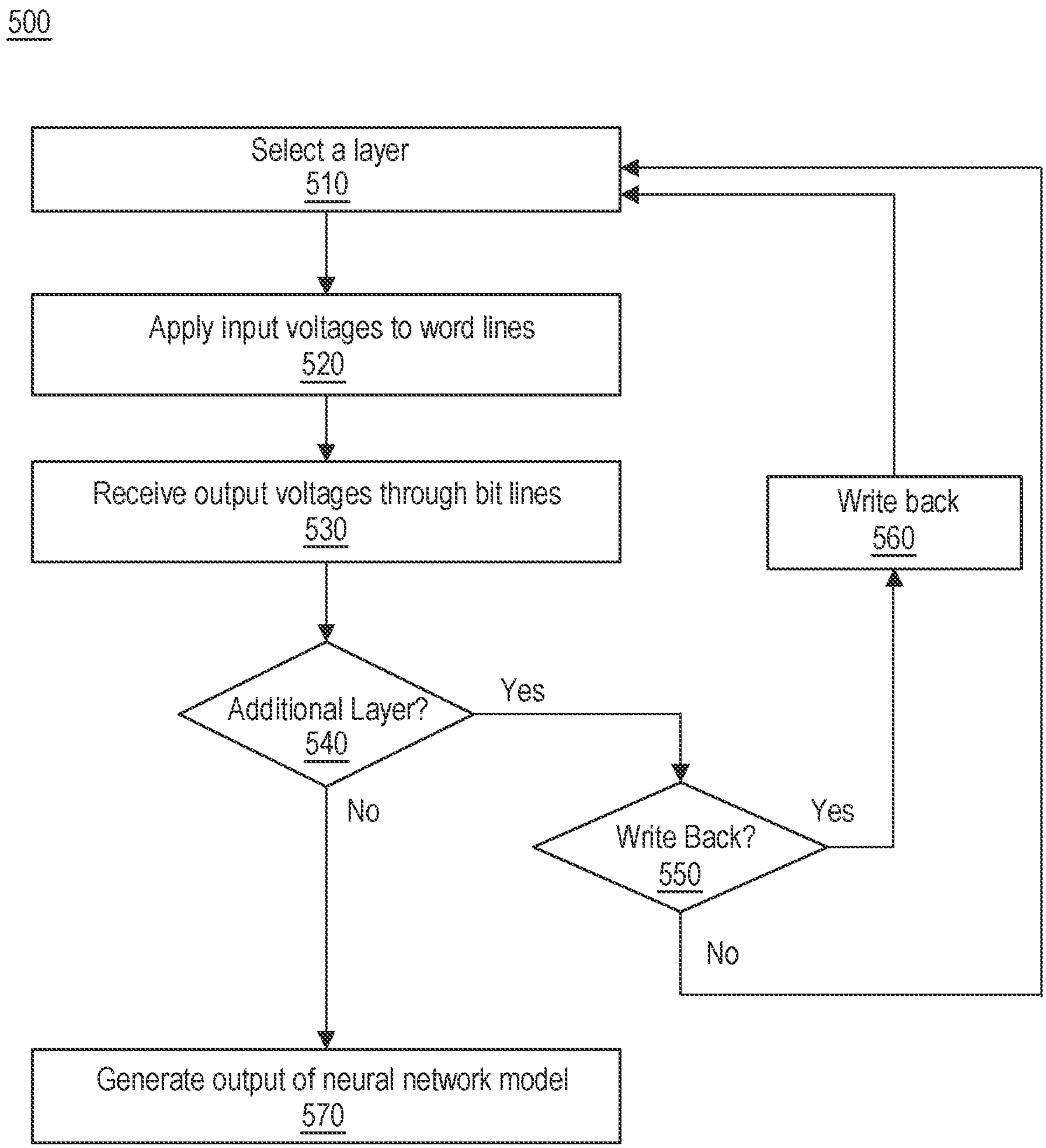
FIG. 5 is a flowchart of a method of performing neuromorphic computation with a three-dimensional memory array, in accordance with some embodiments.

FIG. 5 is a flowchart of a method 500 of performing neuromorphic computation with a three-dimensional memory array, in accordance with some embodiments. In some embodiments, the method 500 is performed by a controller (e.g., controller 105). In some embodiments, the method 500 is performed by other entities. In some embodiments, the method 500 includes more, fewer, or different steps than shown in FIG. 5.

In one approach, the controller selects 510 a layer of a memory array (e.g., memory array 120). In some embodiments, the memory array includes a plurality of memory cells (e.g., memory cells 125) arranged in a three-dimension. The memory array may be embodied in a back end of line layer, and the controller may be embodied in a front end of line layer, such that the memory array may be stacked above the controller. In one aspect, each layer of memory cells 125 along the Z-direction stores weight values of a corresponding weight layer of a neural network model. A set of memory cells 125 in a column of a layer may store weight values to perform multiplications to obtain a value corresponding to a node in a weight layer. The controller may select a layer of the memory array corresponding to a weight layer of the neural network model, and apply a supply voltage to global select lines (e.g., global select lines GSL) coupled to memory cells 125 storing weight values of the weight layer.

In one approach, the controller applies 520 input voltages to word lines WL. A word line controller (e.g., word line controller 114) may apply voltages corresponding to input data corresponding to nodes to obtain multiply-accumulation results corresponding to subsequent nodes. For example, voltages applied to word lines WL in different rows may represent different input values (or nodes X1 . . . Xk) for performing multiply-accumulation operations with weight values in a weight layer of a neural network model.

In one approach, the controller receives 530 output voltages through global bit lines (e.g., global bit lines GBL). In one aspect, local bit lines in a column of the memory array are connected to a corresponding interconnect bit line (e.g., interconnect bit line XBL) of the column, and the corresponding interconnect bit line is connected to a corresponding global bit line (e.g., global bit line GBL) of the column. The controller 105 may include data processing circuits (e.g., data processing circuits 470[0] . . . 470[C−1]). In one aspect, each data processing circuit is coupled to a corresponding global bit line of the memory array. Each data processing circuit may include a sense amplifier (e.g., sense amplifier 260) and a buffer circuit (e.g., buffer circuit 480). Each sense amplifier may be embodied as or part of an analog to digital converter. Hence, each sense amplifier may receive a current or voltage through the global bit line, and determine a corresponding value of the received current or voltage in a digital representation. The buffer circuit may store the determined value.

In one aspect, because each memory cell may perform a multiplication function according to a voltage applied through a word line and a bit stored by the memory cell, the memory cells in a column in a layer may perform multiplications to obtain a value corresponding to a node. In one aspect, current through local bit lines of a column can be combined through a corresponding interconnect bit line of the column and flow through a global bit line (e.g., global bit line GBL) of the column. Accordingly, accumulation or summation of multiplication results for a node can be performed in an efficient manner by combining current through local bit lines of a column.

In one aspect, multiply-accumulation operations can be performed per layer (or per multiple layers). In one approach, in response to signals applied through word lines in a layer, current can flow through different global bit lines GBL, where current through each global bit line GBL may correspond to a multiply-accumulation result of a corresponding node for a weight layer of a neural network model. Hence, multiply-accumulation operations for different nodes in a layer (or multiple layers) can be performed simultaneously to improve operating speed.

In one approach, the controller determines 540 whether computations through an additional layer should be performed. If an additional layer of the memory array to perform computations exists, the controller may determine 550 whether a write back operation should be performed. A write back operation may be performed, depending on a particular architecture of a neural network model. For example, for a multiple layer computation, a write back operation can be performed, according to a computation of a previous layer (or previous layers). If a write back operation should be performed, the buffer circuit may perform 560 the write back operation by generating a voltage or a current corresponding to the stored value and applying the voltage or current to the corresponding global bit line. After or while performing the write back operation, the controller may proceed to the step 510 and select a subsequent layer. If the write back operation is not needed, the controller may bypass the step 560 and proceed to the step 510 and select the subsequent layer. In some embodiments, the controller may apply the values stored by the buffer circuits as inputs to the subsequent layer. For example, voltages corresponding to the stored values may be applied to word lines in the subsequent layer of the memory array.

In one approach, in response to determining that no additional layer of the neural network model to perform computations exists, the controller may generate 570 an output of neural network model. The output of the neural network model may correspond to a result of an image processing, object recognition, feature extraction, speech recognition, etc.

Beneficially, the disclosed device can achieve several advantages. In one implementation, a neuromorphic computation involves storing a large number (e.g., more than billions) of weight values of a neural network model in a memory array, applying input voltages corresponding to input values of nodes of the neural network model to the memory array, and receiving output voltages corresponding to multiply-accumulation results from the memory array. Performing a large number of multiply-accumulation operations with a large number of logic circuits (e.g., adders, multipliers) can consume a large amount of power and reduce the speed of performing neuromorphic computations. In one aspect, a three-dimensional memory array may be configured or arranged to perform a set of multiply-accumulation operations without implementing complex logic circuits, such that the disclosed device can perform neuromorphic computations in a power efficient manner with an improved operating speed. Moreover, the three-dimensional memory array can store a large number of weight values (e.g., more than billions) in a small area, such that the disclosed device can be implemented in an area efficient manner.

Furthermore, the disclosed device can achieve power savings with an improved operating speed by reducing lengths of routing metal rails. In one implementation, lengths of routing metals for applying the input voltages to a two-dimensional memory array or receiving the output voltages from the two-dimensional memory array may increase, according to the number of nodes in the neural network model. Parasitic components such as parasitic capacitance and parasitic resistance of long routing metal rails may increase the power consumption or reduce the speed of the neuromorphic computations. By disposing or stacking the three-dimensional memory array above the controller for controlling operations of the three-dimensional memory array, lengths of routing metal rails between the three-dimensional memory array and the controller can be reduced. By reducing the lengths of routing metal rails between the three-dimensional memory array and the controller, the disclosed device can achieve power savings and an improved operating speed.

Figure 6:
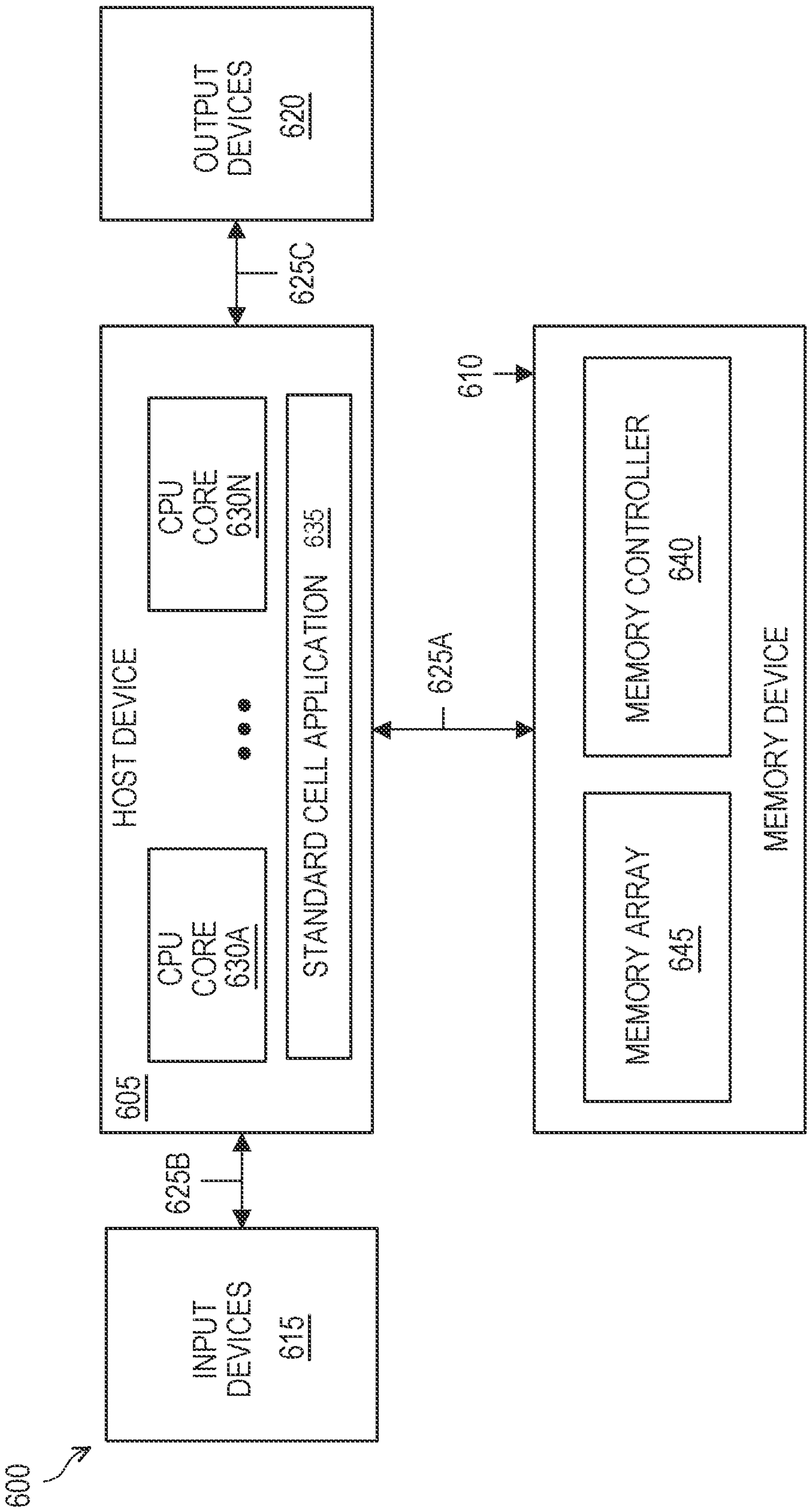
FIG. 6 is an example block diagram of a computing system, in accordance with some embodiments.

Referring now to FIG. 6, an example block diagram of a computing system 600 is shown, in accordance with some embodiments of the disclosure. The computing system 600 may be used by a circuit or layout designer for integrated circuit design. A "circuit" as used herein is an interconnection of electrical components such as resistors, transistors, switches, batteries, inductors, or other types of semiconductor devices configured for implementing a desired functionality. The computing system 600 includes a host device 605 associated with a memory device 610. The host device 605 may be configured to receive input from one or more input devices 615 and provide output to one or more output devices 620. The host device 605 may be configured to communicate with the memory device 610, the input devices 615, and the output devices 620 via appropriate interfaces 625A, 625B, and 625C, respectively. The computing system 600 may be implemented in a variety of computing devices such as computers (e.g., desktop, laptop, servers, data centers, etc.), tablets, personal digital assistants, mobile devices, other handheld or portable devices, or any other computing unit suitable for performing schematic design and/or layout design using the host device 605.

The input devices 615 may include any of a variety of input technologies such as a keyboard, stylus, touch screen, mouse, track ball, keypad, microphone, voice recognition, motion recognition, remote controllers, input ports, one or more buttons, dials, joysticks, and any other input peripheral that is associated with the host device 605 and that allows an external source, such as a user (e.g., a circuit or layout designer), to enter information (e.g., data) into the host device and send instructions to the host device. Similarly, the output devices 620 may include a variety of output technologies such as external memories, printers, speakers, displays, microphones, light emitting diodes, headphones, video devices, and any other output peripherals that are configured to receive information (e.g., data) from the host device 605. The "data" that is either input into the host device 605 and/or output from the host device may include any of a variety of textual data, circuit data, signal data, semiconductor device data, graphical data, combinations thereof, or other types of analog and/or digital data that is suitable for processing using the computing system 600.

The host device 605 includes or is associated with one or more processing units/processors, such as Central Processing Unit ("CPU") cores 630A-630N. The CPU cores 630A-630N may be implemented as an Application Specific Integrated Circuit ("ASIC"), Field Programmable Gate Array ("FPGA"), or any other type of processing unit. Each of the CPU cores 630A-630N may be configured to execute instructions for running one or more applications of the host device 605. In some embodiments, the instructions and data to run the one or more applications may be stored within the memory device 610. The host device 605 may also be configured to store the results of running the one or more applications within the memory device 610. Thus, the host device 605 may be configured to request the memory device 610 to perform a variety of operations. For example, the host device 605 may request the memory device 610 to read data, write data, update or delete data, and/or perform management or other operations. One such application that the host device 605 may be configured to run may be a standard cell application 635. The standard cell application 635 may be part of a computer aided design or electronic design automation software suite that may be used by a user of the host device 605 to use, create, or modify a standard cell of a circuit. In some embodiments, the instructions to execute or run the standard cell application 635 may be stored within the memory device 610. The standard cell application 635 may be executed by one or more of the CPU cores 630A-630N using the instructions associated with the standard cell application from the memory device 610. In one example, the standard cell application 635 allows a user to utilize pre-generated schematic and/or layout designs of the device 100 or a portion of the device 100 to aid integrated circuit design. After the layout design of the integrated circuit is complete, multiples of the integrated circuit, for example, including the device 100, the memory array 120, the controller 105, or any portion of the device 100 can be fabricated according to the layout design by a fabrication facility.

Referring still to FIG. 6, the memory device 610 includes a controller 640 that is configured to read data from or write data to a memory array 645. The memory array 645 may include a variety of volatile and/or non-volatile memories. For example, in some embodiments, the memory array 645 may include NAND flash memory cores. In other embodiments, the memory array 645 may include NOR flash memory cores, Static Random Access Memory (SRAM) cores, Dynamic Random Access Memory (DRAM) cores, Magnetoresistive Random Access Memory (MRAM) cores, Phase Change Memory (PCM) cores, Resistive Random Access Memory (ReRAM) cores, 3D XPoint memory cores, ferroelectric random-access memory (FeRAM) cores, and other types of memory cores that are suitable for use within the memory array. The memories within the memory array 645 may be individually and independently controlled by the controller 640. In other words, the controller 640 may be configured to communicate with each memory within the memory array 645 individually and independently. By communicating with the memory array 645, the controller 640 may be configured to read data from or write data to the memory array in response to instructions received from the host device 605. Although shown as being part of the memory device 610, in some embodiments, the controller 640 may be part of the host device 605 or part of another component of the computing system 600 and associated with the memory device 610. The controller 640 may be implemented as a logic circuit in either software, hardware, firmware, or combination thereof to perform the functions described herein. For example, in some embodiments, the controller 640 may be configured to retrieve the instructions associated with the standard cell application 635 stored in the memory array 645 of the memory device 610 upon receiving a request from the host device 605.

It is to be understood that only some components of the computing system 600 are shown and described in FIG. 6. However, the computing system 600 may include other components such as various batteries and power sources, networking interfaces, routers, switches, external memory systems, controllers, etc. Generally speaking, the computing system 600 may include any of a variety of hardware, software, and/or firmware components that are needed or considered desirable in performing the functions described herein. Similarly, the host device 605, the input devices 615, the output devices 620, and the memory device 610 including the controller 640 and the memory array 645 may include other hardware, software, and/or firmware components that are considered necessary or desirable in performing the functions described herein.

In one aspect of the present disclosure, a device for neuromorphic computation is disclosed. In some embodiments, the device includes a three-dimensional memory array including a plurality of memory cells to store a plurality sets of weight values of a neural network model. In some embodiments, the device includes a set of sensing circuits to determine multiply-accumulation results from the three-dimensional memory array. In some embodiments, the three-dimensional memory array is disposed above the set of sensing circuits along a first direction.

In another aspect of the present disclosure, a device for neuromorphic computation is disclosed. In some embodiments, the device includes a back end of line layer and a front end of line layer. In some embodiments, the back end of line layer includes a three-dimensional memory array. The three-dimensional memory array may include a plurality of memory cells to store a plurality sets of weight values of a neural network model. In some embodiments, the front end of line layer includes a controller to apply one or more input voltages corresponding to an input to the neural network model to the three-dimensional memory array, and to receive one or more output voltages from the three-dimensional memory array to perform computations of the neural network model.

In yet another aspect of the present disclosure, a method for performing neuromorphic computation is disclosed. In some embodiments, the method includes applying, by a word line control circuit in a first layer, one or more input voltages to a three-dimensional memory array disposed in a second layer above the first layer. In some embodiments, the method includes receiving, by a set of sensing circuits in the first layer from the three-dimensional memory array in the second layer, one or more output voltages in response to the one or more input voltages. In some embodiments, the one or more input voltages correspond to input data of one or more weight layers of the neural network model. In some embodiments, the one or more output voltages correspond to computation results of the one or more weight layers of the neural network model.

The term "coupled" and variations thereof includes the joining of two members directly or indirectly to one another. The term "electrically coupled" and variations thereof includes the joining of two members directly or indirectly to one another through conductive materials (e.g., metal or cupper traces). Such joining may be stationary (e.g., permanent or fixed) or moveable (e.g., removable or releasable). Such joining may be achieved with the two members coupled directly with or to each other, with the two members coupled with each other using a separate intervening member and any additional intermediate members coupled with one another, or with the two members coupled with each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above. Such coupling may be mechanical, electrical, or fluidic.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:

a three-dimensional memory array including a plurality of memory cells to store a plurality sets of weight values of a neural network model; and a set of sensing circuits to determine multiply-accumulation results from the three-dimensional memory array, wherein the three-dimensional memory array is disposed above the set of sensing circuits along a first direction;

wherein the three-dimensional memory array includes:

a plurality of local select lines extending along the first direction, the plurality of local select lines including a plurality of sets of local select lines, the plurality of sets of local select lines being spaced from one another along a second direction orthogonal to the first direction;

a plurality of local bit lines extending along the first direction, the plurality of local bit lines including a plurality of sets of local bit lines, the plurality of sets of local bit lines being spaced from one another along the second direction; and a plurality of word lines extending along a third direction orthogonal to the first and second directions, the plurality of word lines including a plurality of sets of word lines, the plurality of sets of word lines being spaced from one another along the second direction.

2. The device of claim 1, wherein the three-dimensional memory array includes:

a first layer of memory array to store a first set of weight values of the plurality of sets of weight values, and a second layer of memory array to store a second set of weight values of the plurality of sets of weight values, wherein the second layer of memory array is disposed between the first layer of memory array and the set of sensing circuits.

3. The device of claim 1, wherein the three-dimensional memory array is formed in a back end of line layer, and wherein the set of sensing circuits is formed in a front end of line layer.

4. The device of claim 1, wherein each of the sets of local select lines further incudes a plurality of subsets of local select lines, each of the subsets of local select lines being coupled to corresponding memory cells of the plurality of memory cells that are arranged along the first direction, each of the sets of local bit lines further incudes a plurality of subsets of local bit lines, each of the subsets of local bit lines being coupled to corresponding memory cells of the plurality of memory cells that are arranged along the first direction, and each of the sets of word lines further incudes a plurality of subsets of word lines, each of the subsets of word lines being coupled to corresponding memory cells of the plurality of memory cells that are arranged along the third direction.

5. The device of claim 1, wherein the three-dimensional memory array further includes:

a set of interconnect bit lines extending along the second direction, each of the set of interconnect bit lines coupled to corresponding local bit lines of the sets of local bit lines.

6. The device of claim 5, wherein the three-dimensional memory array further includes:

a set of global bit lines extending along the first direction, each of the set of global bit lines coupled between: i) a corresponding one of the set of interconnect bit lines, and ii) a corresponding one of the set of sensing circuits.

7. The device of claim 1, further comprising:

a set of buffer circuits, each of the set of buffer circuits including:

an input coupled to an output of a corresponding one of the set of sensing circuits, and an output coupled to an input of the corresponding one of the set of sensing circuits.

8. The device of claim 7, wherein the three-dimensional memory array is formed in a back end of line layer, and wherein the set of sensing circuits and the set of buffer circuits are formed in a front end of line layer.

9. The device of claim 7, wherein each of the set of sensing circuits is an analog to digital converter.

10. A device comprising:

a back end of line layer including a three-dimensional memory array, the three-dimensional memory array including a plurality of memory cells to store a plurality sets of weight values of a neural network model; and a front end of line layer including:

a controller to:

apply one or more input voltages corresponding to an input to the neural network model to the three-dimensional memory array, and receive one or more output voltages from the three-dimensional memory array to perform computations of the neural network model;

wherein the three-dimensional memory array includes:

a plurality of local select lines extending along the first direction, the plurality of local select lines including a plurality of sets of local select lines, the plurality of sets of local select lines being spaced from one another along a second direction orthogonal to the first direction;

a plurality of local bit lines extending along the first direction, the plurality of local bit lines including a plurality of sets of local bit lines, the plurality of sets of local bit lines being spaced from one another along the second direction; and a plurality of word lines extending along a third direction orthogonal to the first and second directions, the plurality of word lines including a plurality of sets of word lines, the plurality of sets of word lines being spaced from one another along the second direction.

11. The device of claim 10, wherein the three-dimensional memory array includes:

a first layer of memory array to store a first set of weight values of the plurality of sets of weight values, and a second layer of memory array to store a second set of weight values of the plurality of sets of weight values, wherein the second layer of memory array is disposed between the first layer of memory array and the controller.

12. The device of claim 10, wherein each of the sets of local select lines further incudes a plurality of subsets of local select lines, each of the subsets of local select lines being coupled to corresponding memory cells of the plurality of memory cells that are arranged along the first direction, each of the sets of local bit lines further incudes a plurality of subsets of local bit lines, each of the subsets of local bit lines being coupled to corresponding memory cells of the plurality of memory cells that are arranged along the first direction, and each of the sets of word lines further incudes a plurality of subsets of word lines, each of the subsets of word lines being coupled to corresponding memory cells of the plurality of memory cells that are arranged along the third direction.

13. The device of claim 12, wherein the three-dimensional memory array further includes:

a set of interconnect bit lines extending along the second direction, each of the set of interconnect bit lines coupled to corresponding local bit lines of the sets of local bit lines.

14. The device of claim 13, wherein the controller includes a set of sensing circuits, and wherein the three-dimensional memory array further includes a set of global bit lines extending along the first direction, each of the set of global bit lines coupled between: i) a corresponding one of the set of interconnect bit lines, and ii) a corresponding one of the set of sensing circuits.

15. The device of claim 14, wherein the front end of line layer includes a set of buffer circuits, each of the set of buffer circuits including:

an input coupled to an output of a corresponding one of the set of sensing circuits, and an output coupled to an input of the corresponding one of the set of sensing circuits.

16. The device of claim 15, wherein the front end of line layer includes a set of word line controllers to apply, to a corresponding layer of memory cells of the plurality of memory cells, one or more voltages corresponding to input data of a corresponding weight layer of the neural network model.

17. The device of claim 14, wherein each of the set of sensing circuits is an analog to digital converter.

18. A method comprising:

applying, by a word line control circuit in a first layer, one or more input voltages to a three-dimensional memory array disposed in a second layer with respect to the first layer along a first direction, wherein the three-dimensional memory array includes: (i) a plurality of local select lines extending along the first direction, the plurality of local select lines including a plurality of sets of local select lines, the plurality of sets of local select lines being spaced from one another along a second direction orthogonal to the first direction; (ii) a plurality of local bit lines extending along the first direction, the plurality of local bit lines including a plurality of sets of local bit lines, the plurality of sets of local bit lines being spaced from one another along the second direction; and (iii) a plurality of word lines extending along a third direction orthogonal to the first and second directions, the plurality of word lines including a plurality of sets of word lines, the plurality of sets of word lines being spaced from one another along the second direction; and receiving, by a set of sensing circuits in the first layer from the three-dimensional memory array in the second layer, one or more output voltages in response to the one or more input voltages, wherein the one or more input voltages correspond to input data of one or more weight layers of a neural network model, and wherein the one or more output voltages correspond to computation results of the one or more weight layers of the neural network model.

19. The method of claim 18, wherein each of the one or more outputs voltages corresponds to a multiply-accumulation result of the neural network model.

20. The method of claim 18, further comprising:

determining, by a sensing circuit of the set of sensing circuits, a computation result of a portion of the neural network model, according to one of the one or more output voltages received through a corresponding one of the plurality of local bit lines; and applying, by a buffer circuit in the first layer, a voltage corresponding to the computation result to the corresponding local bit line.

* * * * *